(12) United States Patent
Kim et al.

(10) Patent No.: US 7,668,028 B2
(45) Date of Patent: Feb. 23, 2010

(54) DUAL IN-LINE MEMORY MODULE, MEMORY TEST SYSTEM, AND METHOD FOR OPERATING THE DUAL IN-LINE MEMORY MODULE

(75) Inventors: Kyung-Hoon Kim, Kyoungki-do (KR); Yong-Ki Kim, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 119 days.

(21) Appl. No.: 11/819,812

(22) Filed: Jun. 29, 2007

(65) Prior Publication Data

US 2008/0002493 A1    Jan. 3, 2008

(30) Foreign Application Priority Data

Jun. 29, 2006  (KR) ............ 10-2006-0059594
Apr. 27, 2007  (KR) ............ 10-2007-0041097

(51) Int. Cl.
G11C 7/00   (2006.01)
G11C 7/10   (2006.01)
G11C 8/00   (2006.01)

(52) U.S. Cl. ............ 365/201; 365/189.05; 365/191; 365/193; 365/230.03; 365/233.1

(58) Field of Classification Search ............ 365/189.15, 365/201, 230.03; 714/718
See application file for complete search history.

(56) References Cited

U.S. PATENT DOCUMENTS 5,377,144 A * 12/1994 Brown ............ 365/189.02
5,726,994 A *  3/1998 Matsuura et al. ............ 714/718
6,028,798 A *  2/2000 Roohparvar ............ 365/201
6,313,669 B1 * 11/2001 Suenaga ............ 327/108
6,330,200 B2 * 12/2001 Ooishi ............ 365/201
6,442,716 B1 *  8/2002 Kim ............ 714/718
6,515,922 B1    2/2003 Yamagata
6,560,134 B2 *  5/2003 Brox et al. ............ 365/51
6,615,289 B1 *  9/2003 Feurle et al. ............ 710/14
6,809,975 B2   10/2004 Yamaoka et al.

(Continued)

FOREIGN PATENT DOCUMENTS

EP    1001273 A2 *  5/2000

(Continued)

OTHER PUBLICATIONS

Korean Office Action, with English Translation, issued in Korean Patent Application No. KR 10-2007-0041097, dated Dec. 23, 2009.

Primary Examiner—Ly D Pham
(74) Attorney, Agent, or Firm—IP & T Law Firm PLC

(57) ABSTRACT

A dual in-line memory module (DIMM) for use in test includes a memory array with a plurality of memories, a test signal input/output unit, and a normal data input/output unit. The test signal input/output unit is provided in the respective memories to perform an input/output operation of a test signal with an external test mode controller for a test mode operation. The normal data input/output unit is provided in the respective memories to perform an input/output operation of a normal data with an external memory controller for a normal mode operation.

24 Claims, 7 Drawing Sheets

U.S. PATENT DOCUMENTS

| | | | |
|---|---|---|---|
| 7,051,130 B1 | 5/2006 | Horowitz et al. | |
| 7,222,280 B1* | 5/2007 | West et al. | 714/736 |
| 2002/0015342 A1* | 2/2002 | Kuge | 365/201 |
| 2003/0191998 A1* | 10/2003 | Nakamura | 714/733 |
| 2006/0233036 A1* | 10/2006 | Blodgett et al. | 365/230.01 |
| 2008/0002493 A1* | 1/2008 | Kim et al. | 365/201 |

FOREIGN PATENT DOCUMENTS

| | | | |
|---|---|---|---|
| JP | 2000150564 A | * | 5/2000 |
| JP | 2001-274323 | | 10/2001 |
| JP | 2003-317499 | | 11/2003 |
| KR | 10-2000-0035370 | | 6/2000 |

* cited by examiner

DUAL IN-LINE MEMORY MODULE, MEMORY TEST SYSTEM, AND METHOD FOR OPERATING THE DUAL IN-LINE MEMORY MODULE

CROSS-REFERENCE TO RELATED APPLICATIONS

The present invention claims priority of Korean patent application numbers 10-2006-0059594 and 10-2007-0041097, filed on Jun. 29, 2006, and Apr. 27, 2007, respectively, which are incorporated by reference in their entirety.

BACKGROUND OF THE INVENTION

The present invention relates to a dual in-line memory module (DIMM), and more particularly, to a DIMM that can perform a test mode operation using extra input/output (IO) pads.

In fabricating a semiconductor memory device, it is advantageous that the kind of the semiconductor memory device as a final product is determined at a later stage of the fabrication process.

The reason for this is that as the specific kinds of the product are determined later, more operations can be shared in fabricating various kinds of products.

Specifically, such a sharing conception plays an important role in fabricating the semiconductor memory device. In producing the semiconductor memory device based on a few items/mass productions, the efficiency of the fabricating process can be a crucial factor for competitiveness of manufactures.

One of the important specifications of the semiconductor memory device is a bit organization. The bit organization is expressed by x1, x4, x8, etc. This represents the number of memory cells selected by one address.

That is, the bit organization represents the number of memory cells that are simultaneously read or written by one addressing, and the semiconductor memory devices can be differently configured even though they have the same capacity.

For example, in case of an x4 organization, when one address is inputted, four memory cells are accessed and four bit data are outputted. In case of an x16 organization, when one address is inputted, sixteen memory cells are accessed and sixteen bit data are outputted.

Accordingly, a 16M DRAM can have different bit organizations, for example, 16M×1, 4M×4, 2M×8, etc. The 16M×1 bit organization means that the semiconductor memory device has 16M number of 1-bit cells, and the 4M×4 organization means that the semiconductor memory device has 4M number of 4-bit cells. Also, the 2M×8 organization means that the semiconductor memory device has 2M number of 8-bit cells.

In a viewpoint that the bit organization represents the number of memory cells-that are simultaneously read or written by one addressing, the semiconductor memory device can be expressed by an operation mode. Therefore, it should be noted that the bit organization expression and the operation mode expression can exist together.

That is, the x1, x4 and x8 operation modes of the semiconductor memory device may be used to determine how many data pins the semiconductor memory device sealed by packaging will have.

For example, the x1 operation mode uses one data I/O pin or two data pins separated into a data-in pin and a data-out pin.

Likewise, the x4 operation mode uses four data I/O pins or eight data pins separated into data-in pins and data-out pins.

In addition, the x8 operation mode uses eight data I/O pins or sixteen data pins separated into data-in pins and data-out pins.

The operation modes of the semiconductor memory device vary depending on its usage field.

For example, the x16, further x32, organization is used for a semiconductor memory device having high data bandwidth for the fields requiring high performance, for example a graphic field. The x8 and x4 organizations are widely used in PC systems and server systems.

If fabricating semiconductor memory devices having different operation modes depending on the usage fields and different number of data pins, designs during their fabrication must be changed. Therefore, it is contrary to the sharing conception that it is advantageous to determine the specific kind of the product at a later stage of the fabricating process.

Hence, the DRAM does not have the above-described bit organization at a wafer level during its fabricating process, and the DRAM is assembled in the x4 or x8 bit organization during packaging.

Additionally, most of semiconductor memory devices are produced in a system form for the purpose of high capacity and high performance.

In some applications, e.g., a PC system, the semiconductor memory devices are produced in a module architecture, in which they are integrated on a single printed circuit board (PCB), and the memory modules are mounted in slots of the systems.

Among various types of the memory modules, a dual in-line memory module (DIMM) is widely used.

The DIMM can have various shapes and sizes, and a 168-pin, 184-pin or 240-pin DIMM are available.

The most widely used DIMM has the 184-pin configuration. Because the 184-pin DIMM has perfect x64 data buses, data can be transmitted with a 64-bit data bandwidth. Therefore, the 184-pin DIMM is used as main memory in Pentium or higher desktop systems or server systems.

As described above, one DIMM can have the x64 organization at the module level. In this case, sixteen x4 DRAMs or eight x8 DRAMs are mounted on one module. Meanwhile, one module can have an x72 organization at the module level. In this case, the additional eight bits of the x72 DIMM may be used to control data buses and check partial bit error.

FIG. 1 is a block diagram illustrating a conventional memory controller and a conventional DIMM.

Referring to FIG. 1, a plurality of DIMMs 100 and 170 are connected to one memory controller.

Each of the first DIMM 100 and the second DIMM 170 includes nine DRAMs, each of which has eight data pins DQ0 to DQ7 and clock pins CLK1 and CLK2.

In addition, eight bits DQ64 to DQ71 are added to the DIMMs 100 and 170 and used to control data buses and check a partial bit error.

However, it is impossible for the conventional DIMMs 100 and 170 to enter a test mode or a built-in-self-test (BIST) mode and modify the internal structure of the DRAMs.

That is, the internal logic of the DRAM can be modified using a combination of a command and an address, or a defect test can be performed through a timing control. However, the DIMMs 100 and 170 cannot enter a test mode because a command and an address cannot be applied to the respective DRAMs.

In case that the test cannot be performed in the state of the DIMM 100 and 170, if an error that has not happened during the test of the DRAMs occurs in the DIMMs 100 and 170, the cause of the error cannot be found out.

SUMMARY OF THE INVENTION

Embodiments of the present invention are directed to providing a DIMM that can perform a test mode operation using extra I/O pads.

In accordance with an aspect of the present invention, there is provided a dual in-line memory module (DIMM) for use in test including a memory array with a plurality of memories, a test signal input/output unit, and a normal data input/output unit. The test signal input/output unit is provided in the respective memories to perform an input/output operation of a test signal with an external test mode controller for a test mode operation. The normal data input/output unit is provided in the respective memories to perform an input/output operation of a normal data with an external memory controller for a normal mode operation.

In accordance with another aspect of the present invention, there is provided a packaged memory test system including a memory controller, a test mode controller, and a dual in-line memory module (DIMM). The memory controller controls a normal mode operation of a memory. The test mode controller controls a test mode operation of the memory. The DIMM includes a plurality of first pins connected to the memory controller, a plurality of second pins connected to the test mode controller. The DIMM is configured to selectively perform a normal operation and a test operation. The first pins and the second pins are not shared with one another.

In accordance with still another aspect of the present invention, there is provided a method for operating a dual in-line memory module (DIMM) for use in test. The DIMM includes a plurality of memories having 2N number of data input/output pads, where N is a positive integer. The method includes, at the plurality of memories, performing an input/output operation of a test signal with an external test mode controller through 2N−1 number of data input/output pads in order for a test mode operation; and, at the plurality of memories, performing an input/output operation of a normal data with an external memory controller through 2N−1 data input/output pads for a normal mode operation. The 2N−1 data input/output pads are used for the input/output operation of the normal data and are not shared with the 2N−1 data input/output pads used for the input/output operation of the test signal.

DESCRIPTION OF SPECIFIC EMBODIMENTS

Figure 1:
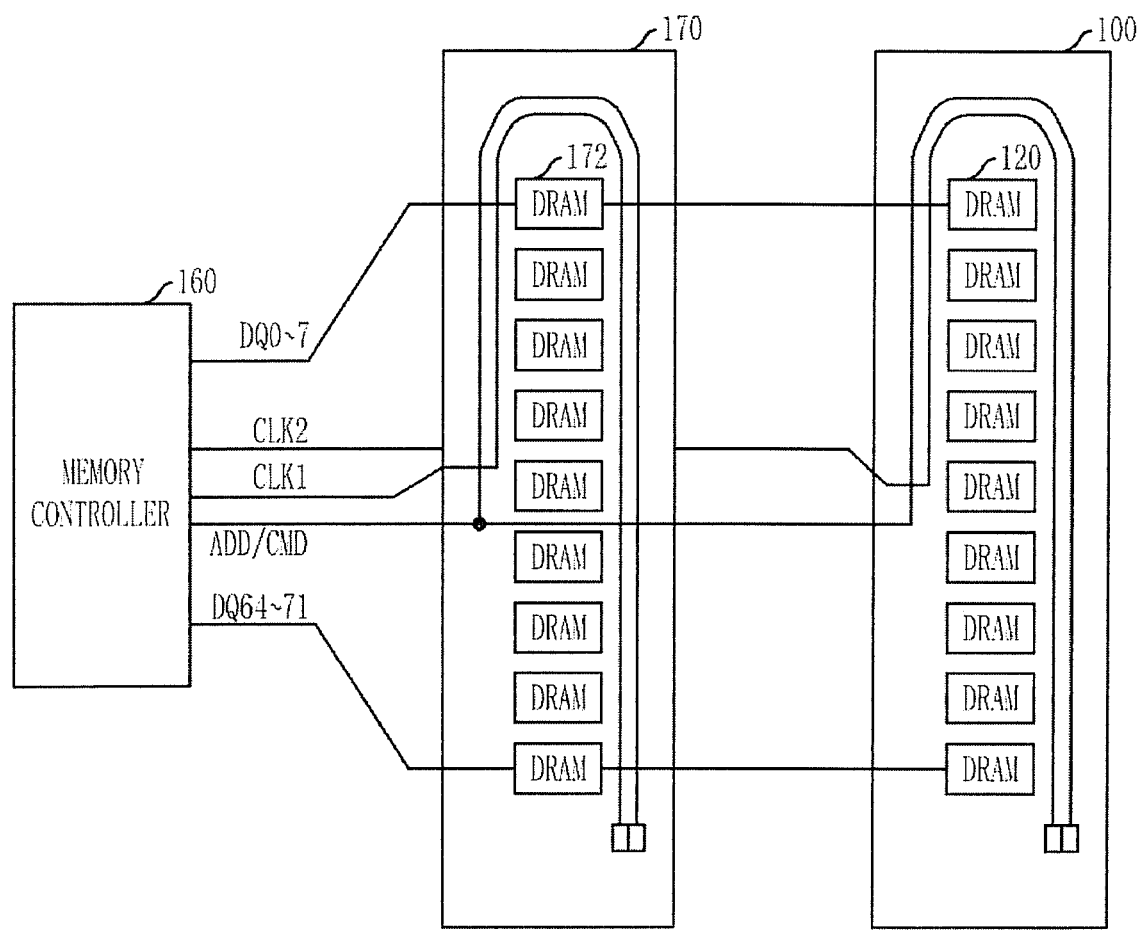
FIG. 1 is a block diagram illustrating a conventional memory controller and a conventional DIMM.
Figure 2:
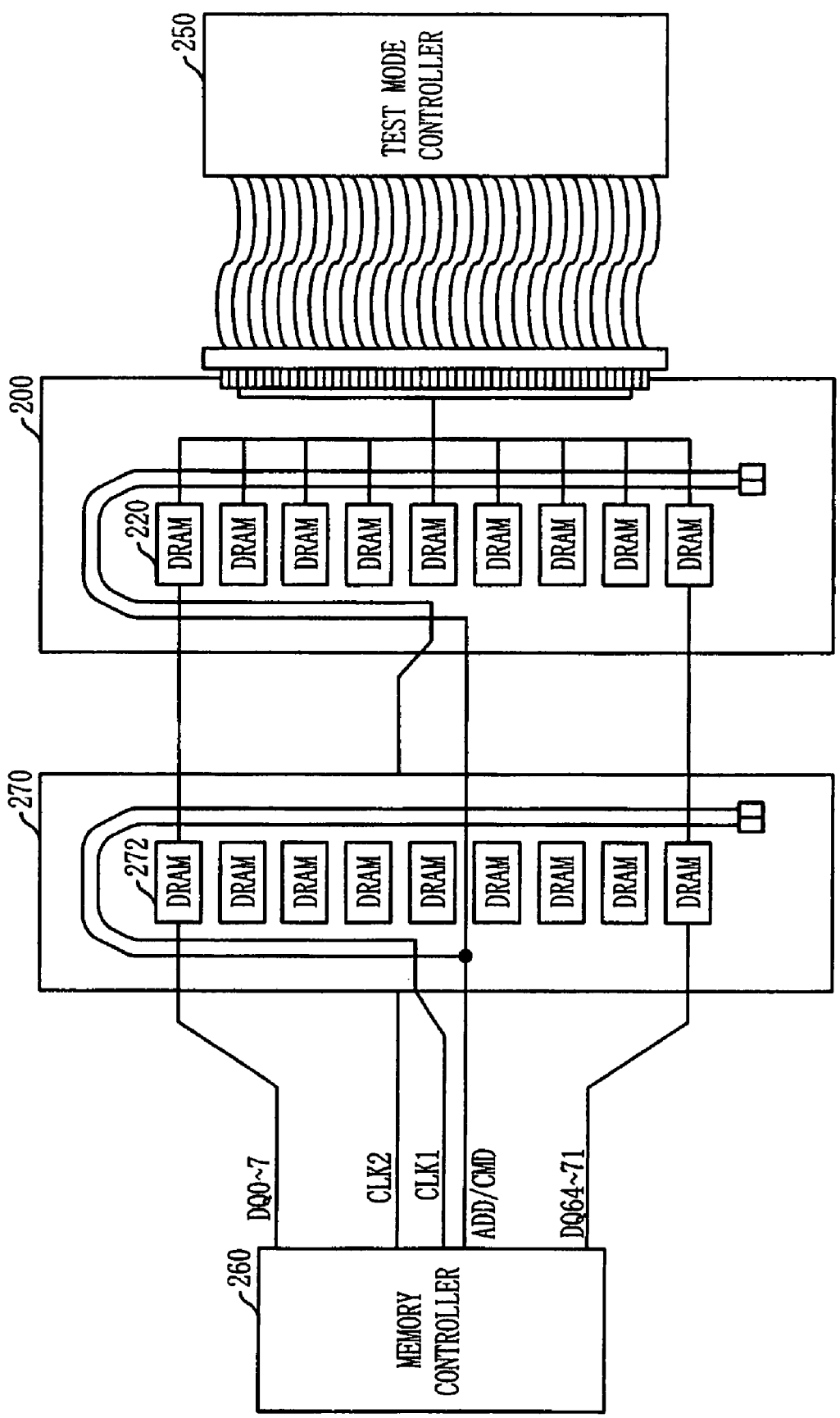
FIG. 2 is a block diagram illustrating a memory controller, a test mode controller, and a DIMM in accordance with an embodiment of the present invention.

FIG. 2 is a block diagram illustrating a memory controller, a test mode controller, and a DIMM in accordance with an embodiment of the present invention.

Referring to FIG. 2, a first DIMM 200 and a second DIMM 270 are connected to one memory controller 260. The second DIMM 270 has the same configuration as the conventional DIMM.

The second typical DIMM 270 is connected only to the memory controller 260, while the second DIMM 200 is connected to the memory controller 260 and the test mode controller 250.

That is, the first DIMM 200 performs a normal operation with the memory controller 260, and performs a test mode operation with the test mode controller 250.

A plurality of DRAMs provided in the first DIMM 200 are connected to the memory controller 260 and the test mode controller 250, and a plurality of DRAMs provided in the second DIMM 270 are connected only to the memory controller 260.

Figure 3:
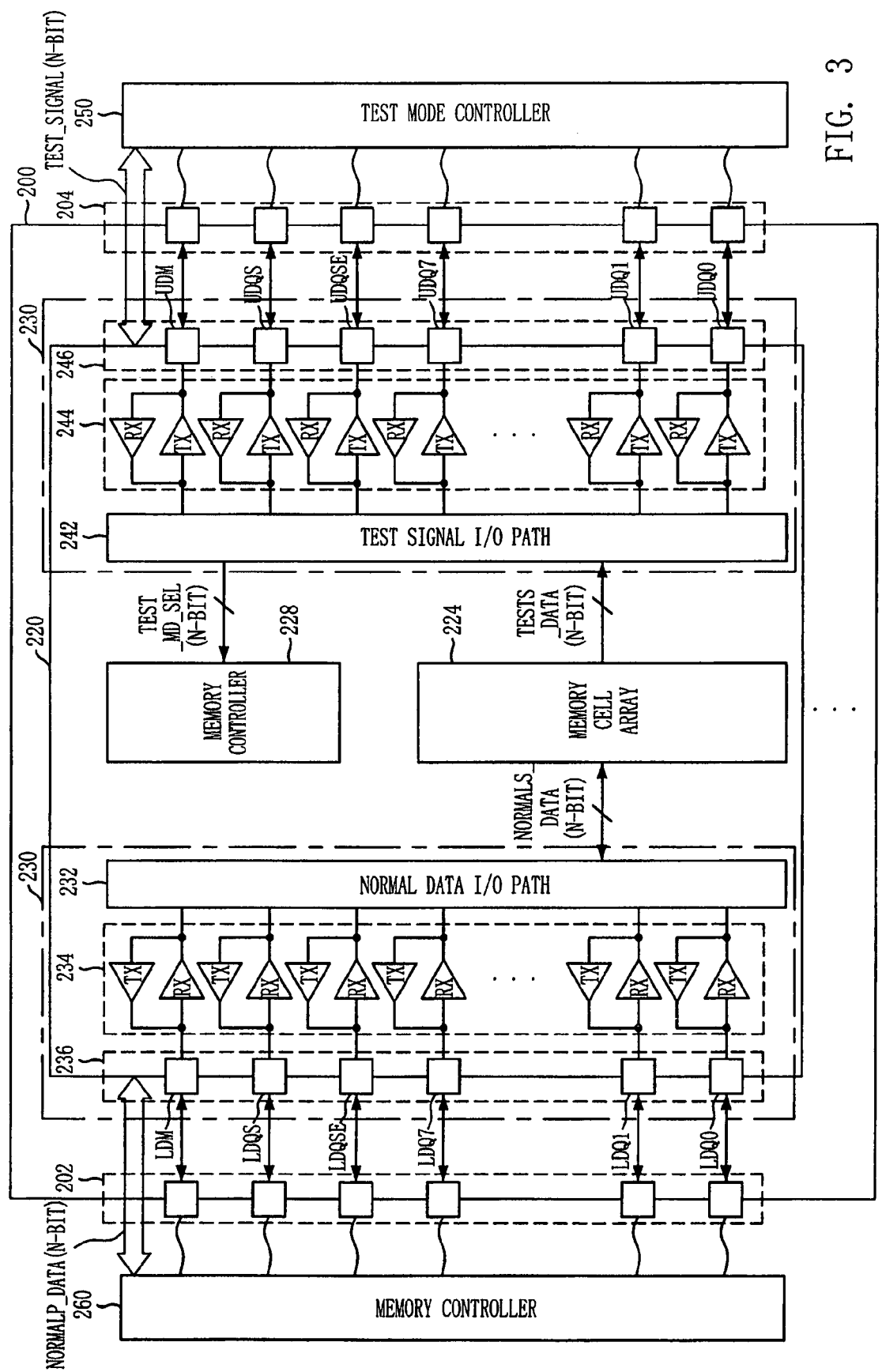
FIG. 3 is a block diagram of the first DIMM illustrated in FIG. 2.

FIG. 3 is a block diagram of the first DIMM illustrated in FIG. 2.

Referring to FIG. 3, the first DIMM 200 includes a memory array with a plurality of memories 220, a test signal I/O unit 240, and a normal data I/O unit 230. The test signal I/O unit 240 is provided in each memory 220 and performs an I/O operation on a test signal TEST_SIGNAL(N-BIT) with the test mode controller 250 for the test mode operation. The normal data I/O unit 230 is provide in each memory 220 and performs an I/O operation on a normal data NORMALP_DATA(N-BIT) with the memory controller 260 for the normal mode operation.

The first DIMM 200 is connected through I/O pins 202 and 204 to the test mode controller 250 and the memory controller 260. In addition, the plurality of DRAMs 220 provided in the first DIMM 200 include DQ pads 236 and 246 connected to the I/O pins 202 and 204.

Therefore, the test signal TEST_SIGNAL(N-BIT) and the normal data NORMALP_DATA(N-BIT) are inputted/outputted through the I/O pins 202 and 204 of the DIMM and the DQ pads 236 and 246 of the memories 220.

Each of the memories 220 includes $2^N$ number of data I/O pads 236 and 246 (where N is a positive integer). The test signal I/O unit 240 and the normal data I/O unit 230 use $2^{N-1}$ number of data I/O pads 246 and 236, which are not shared with one another.

If N=4, each of the memories 220 includes sixteen data I/O pads 236 and 246. The eight data I/O pads 246 are used by the test signal I/O unit 240, and the remaining eight I/O pads 236 are used by the normal data I/O unit 230.

Although the plurality of memories 220 include the data I/O pads 236 and 246 that are operable as X16, they operate as X8 in the normal mode and X8 in the test mode.

Figure 4:
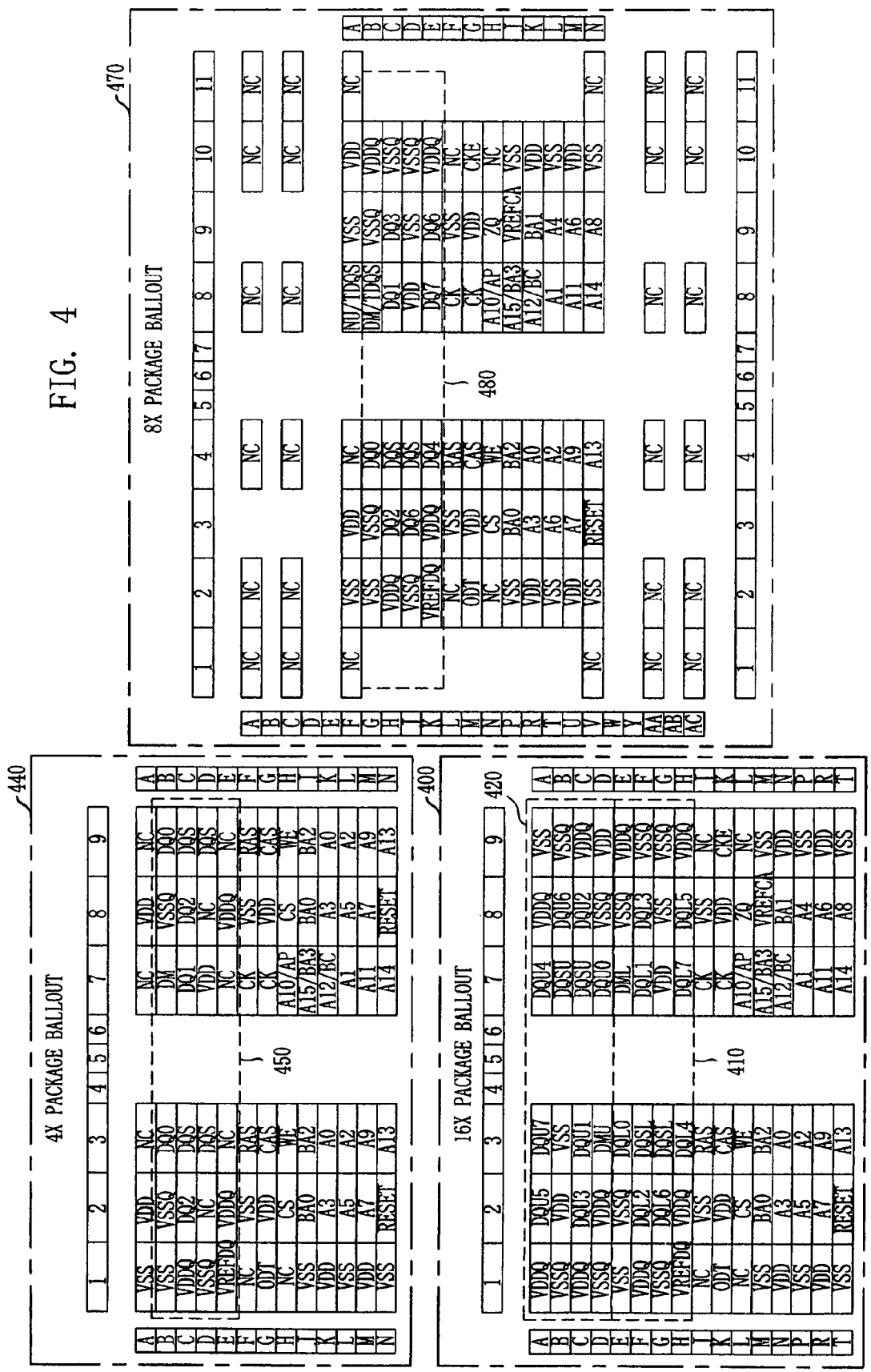
FIG. 4 illustrates a package bailout configuration of X4, X8 and X16 double data rate (DDR) 3 synchronous dynamic random access memory (SDRAM).

FIG. 4 illustrates a package bailout configuration of X4, X8 and X16 double data rate (DDR) 3 synchronous dynamic random access memory (SDRAM).

Referring to FIG. 4, the X16 package bailout configuration 400 includes data I/O bailout divided into a lower bailout 410 and an upper bailout 420.

The lower bailout 410 and the upper bailout 420 include eight DQ pads DQL0 to DQL7 and eight DQ pads DQU0 to DQU7, respectively. Therefore, the X16 package bailout configuration 400 includes a total of sixteen DQ pads.

The X4 package bailout configuration 440 includes four DQ pads DQ0 to DQ3.

The X8 package bailout configuration 470 includes eight DQ pads DQ0 to DQ7.

At this point, the DQ pads DQ0 to DQ3 of the X4 package bailout configuration 440, the DQ pads DQ0 to DQ7 of the X8 package bailout configuration 470, and the DQ pads DQL0 to DQL7 of the lower bailout 410 of the X16 package bailout configuration 400 have the same arrangement.

The X16 DDR3 SDRAM can operate as the X8 or X4 DDR3 SDRAM by using only the DQ pads DQL0 to DQL7 of the lower bailout configuration 410.

TABLE 1

| Product | X4 PAD | X8 PAD | X16 PAD |
| --- | --- | --- | --- |
| X4 Product | VDD | VSS | VSS |
| X8 Product | VSS | VDD | VSS |
| X16 Product | VSS | VSS | VDD |
| TM X4 Product | VDD | VSS | VDD |
| TM X8 Product | VSS | VDD | VDD |

As can be seen from Table 1, after the semiconductor memory devices are packaged using the chip having the X16 data I/O pads at a wafer level, the same chip can be used in the X4, X8 or X16 mode according to which power is applied the extra pads X4 PAD, X8 PAD and X16 PAD used as an option. The extra pads X4 PAD, X8 PAD and X16 PAD are previously set at a package level.

That is, even though the semiconductor memory device is packaged in the X16 organization, the operation mode can be changed using the fuse option or the extra pads X4 PAD, X8 PAD and X16 PAD within the chip.

Since the TM X4 product and the TM X8 product in Table 1 are advantageous in the present invention, they will be described later in detail.

The operation of the first DIMM 200 will be described below with reference to FIGS. 3 and 4.

The plurality of DRAMs 220 of the first DIMM 200 are configured in the X16 package.

The upper DQ pads UDM, UDQS, UDQSB and UDQ0 to UDQ7 of the X16 package DRAM are connected to the test mode controller 250 and used to input/output the test signal TEST_SIGNAL(N-BIT).

In addition, the lower DQ pads LDM, LDQS, LDQSB and LDQ0 to LDQ7 of the X16 package memory is connected to the memory controller 260 and used to input/output the normal data NORMALP_DATA(N-BIT).

That is, the plurality of DRAMs 220 of the first DIMM 200 are packaged in the X16 organization, they operate as X8 in the normal mode and the test mode.

The TM X4 product in Table 1 represents the product that is packaged in the X16 organization but operates in the X4 mode.

The plurality of DRAMs 220 input/output the test signal TEST_SIGNAL(N-BIT) using the test mode controller 250 and the DQ pads UDM, UDQS, UDQSB and UDQ0 to UDQ3 of the upper DQ pads, and inputs/outputs the normal data NORMALP_DATA(N-BIT) using the memory controller 260 and the DQ pads LDM, LDQS, LDQSB and LDQ0 to LDQ3 of the lower DQ pads.

The TM X8 product in Table 1 represents the product that is packaged in the X16 organization but operates in the X8 mode.

The plurality of DRAMs 220 input/output the test signal TEST_SIGNAL(N-BIT) using the test mode controller 250 and the upper DQ pads UDM, UDQS, UDQSB and UDQ0 to UDQ7, and input/output the normal data NORMALP_DATA (N-BIT) using the memory controller 260 and the lower DQ pads LDM, LDQS, LDQSB and LDQ0 to LDQ3.

Figure 5:
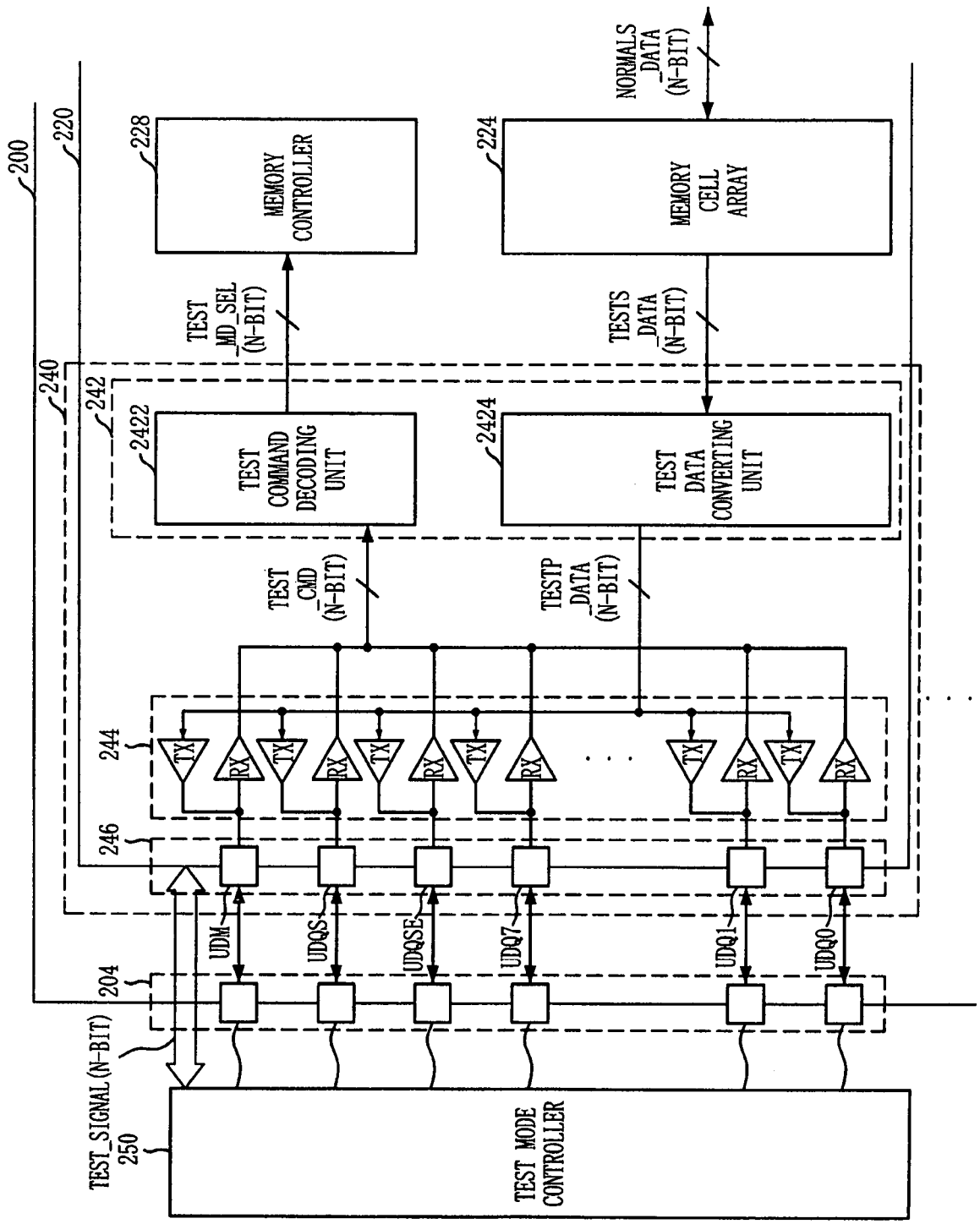
FIG. 5 is a block diagram of a test signal I/O unit included in a DRAM of a first DIMM shown in FIG. 3.

FIG. 5 is a block diagram of the test signal I/O unit 240 included in the DRAM of the first DIMM shown in FIG. 3.

Referring to FIG. 5, the test signal I/O unit 240 divides the test signal TEST_SIGNAL into a test command TEST_CMD (N-BIT) and a test data TESTP_DATA(N-BIT).

The process of dividing the test signal TEST_SIGNAL(N-BIT) into the test command TEST_CMD(N-BIT) and the test data TESTP_DATA(N-BIT) will be described below.

The test command TEST_CMD(N-BIT) refers to the test signal TEST_SIGNAL(N-BIT) generated from the test mode controller 250 and inputted to the memory controller 228 of the DRAMs 220.

The reason for this is that the plurality of DRAMs 220 can perform the test mode operation in response to the test signal TEST_SIGNAL(N-BIT) generated from the test mode controller 250.

The test data TESTP_DATA(N-BIT) refers to the test signal TEST_SIGNAL(N-BIT) outputted from the memory cell array 224 of the DRAMs 220 to the test mode controller 250.

The reason for this is that data stored in the memory cell array 224 of the DRAMs 220 and outputted to the test mode controller 250 in the test mode operation are generated by the test mode operation.

More specifically, the test signal I/O unit 240 includes the DQ pads UDM, UDQS, UDQSB and UDQ0 to UDQ7 for inputting/outputting the test signal TEST_SIGNAL(N-BIT), including the test command TEST_CMD(N-BIT) and the test data TESTP_DATA(N-BIT), to the test mode controller 250.

The DQ pads UDM, UDQS, UDQSB and UDQ0 to UDQ7 are connected to the test mode controller 250 through the I/O pins 204 provided in the DIMM.

In addition, the test signal I/O unit 240 includes a test signal I/O path 242 for transferring the test command TEST_CMD (N-BIT) of the test signal TEST_SIGNAL(N-BIT), which is inputted through the DQ pads UDM, UDQS, UDQSB and UDQ0 to UDQ7, to the test controller 228 of the DRAMs 220, or transferring the test data TEST_DATA(N-BIT) from the memory cell array 224 of the DRAMs 220 to the DQ pads UDM, UDQS, UDQSB and UDQ0 to UDQ7.

The test signal I/O unit 240 further includes a buffering unit 244 for buffering the test signal TEST_SIGNAL(N-BIT) inputted/outputted between the DQ pads UDM, UDQS, UDQSB and UDQ0 to UDQ7 and the test signal I/O path 242.

The test signal I/O path 242 includes a command decoding unit 2422 and a test data converting unit 2424. The command decoding unit 2422 decodes the test command TEST_CMD (N-BIT) inputted through the DQ pads UDM, UDQS, UDQSB and UDQ0 to UDQ7 to generate a test mode select signal TEST_MD_SEL(N-BIT). The test data converting unit 2424 converts the serial test data TESTS_DATA(N-BIT) from the memory cell array 224 of the DRAMs 220 into parallel test data TESTP_DATA(N-BIT).

Figure 6:
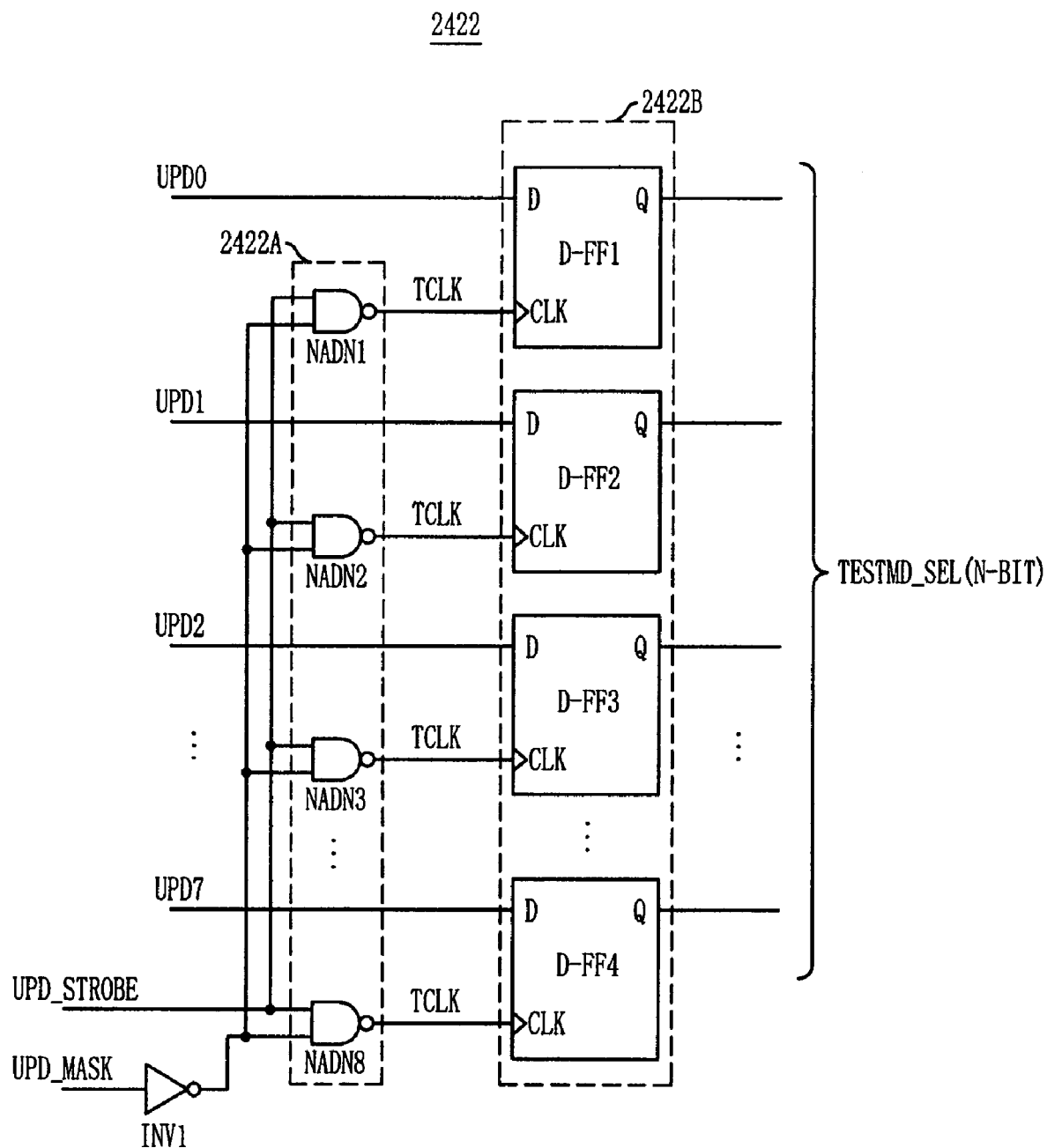
FIG. 6 is a circuit diagram of a test command decoding unit illustrated in FIG. 5.

FIG. 6 is a circuit diagram of the test command decoding unit 2422 of the DRAM included in the first DIMM 200.

Referring to FIG. 6, the test command decoding unit 2422 divides the test command TEST_CMD(N-BIT) into a test strobe signal UPD_STROBE inputted through the DQ pad UDQS, a test mode mask signal UPD_MASK inputted through the DQ pad UDM, and a plurality of operation signals UPD0, UPD1, UPD2, . . . , UPD7 inputted through the DQ pads UDQ0 to UDQ7 according to its usage.

The test strobe signal UPD_STROBE serves as a reference of input unit when the plurality of test operation signals UPD0, UPD1, UPD2 and UPD2 to UPD7 are inputted. Every when one toggling occurs, the plurality of test operation signals UPD0, UPD1, UPD2, . . . , UPD7 are inputted one time.

The test mode mask signal UPD_MASK is a signal influencing the test mode operation period. In case where the test mode mask signal UPD_MASK is activated, the DIMM enters the test mode when the plurality of test operation signals UPD0, UPD1, UPD2, . . . , UPD7 having a predetermined logic level are inputted. In case where the test mode mask signal UPD_MASK is deactivated, the test command decoding unit 2422 exits from the test mode.

The plurality of test operation signals UPD0, UPD1, UPD2, . . . , UPD7 are signals for controlling the test operation through the logic level transition in the test mode.

More specifically, the test command decoding unit 2422 includes a test operation clock generating circuit 2422A and a test mode select signal output circuit 2422B. The test operation clock generating circuit 2422A generates a test operation clock TCLK in response to the test strobe signal UPD_STROBE and the test mode mask signal UPD_MASK, and the test mode select signal output circuit 2422B outputs the plurality of test operation signals UPD0, UPD1, UPD2, . . . , UPD7 as the test mode select signal TEST_MD_SEL(N-BIT) in response to the test operation clock TCLK.

The test operation clock generating circuit 2422A includes an inverter INVL configured to invert the test mode mask signal UPD_MASK, and a plurality of NAND gates NAND1, NAND2, NAND3, . . . , NAND8 configured to receive the inverted test mode mask signal UPD_MASK and the test strobe signal UPD_STROBE to output the test operation clock TCLK.

The test mode select signal outputting circuit 2422B includes a plurality of D flip-flops D-FF1, D-FF2, D-FF3, . . . , D-FF8, which respectively have clock input terminals CLK receiving the test operation clock TCLK, data input terminals D receiving the test operation signals UPD0, UPD1, UPD2, . . . , UPD7, and data output terminals Q outputting the test mode select signals TEST_MD_SEL(N-BIT).

Figure 7:
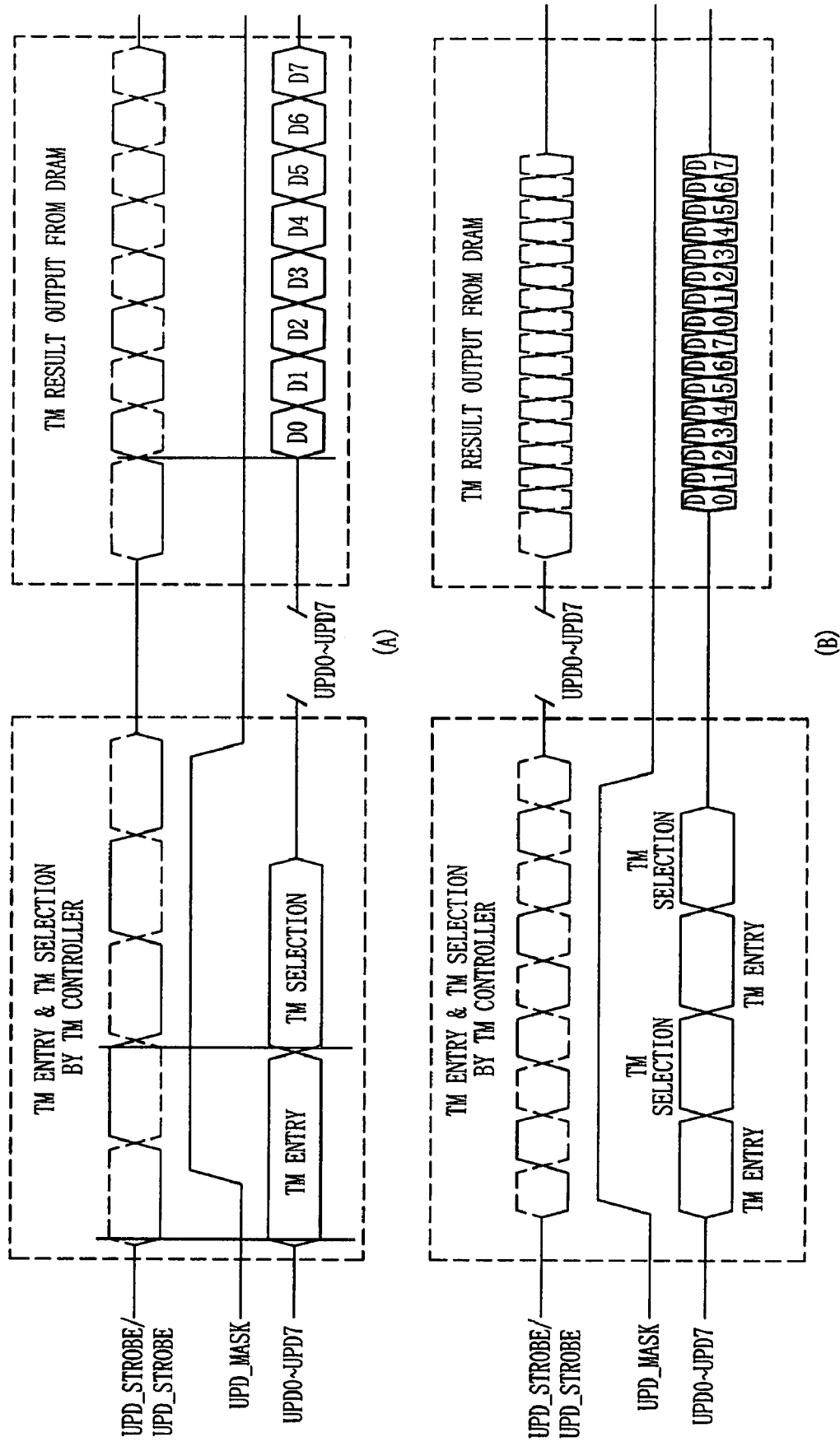
FIG. 7 is a timing diagram illustrating a process of entering a test mode, a process of selecting a test operation, and a process of outputting a test data after the test operation is completed in the DIMM in accordance with the embodiment of the present invention.

FIG. 7 is a timing diagram illustrating the process of entering the test mode, the process of selecting the test operation, and the process of outputting the test-data after the test operation is completed in the DIMM in accordance with the embodiment of the present invention.

First, the process of entering the test mode will be described with reference to FIG. 7(A). In such a state that the test mask signal UPD_MASK of the test command TEST_CMD(N-BIT) is activated to a logic high level, the DIMM enters the test mode when the test operation signals UPD0, UPD1, UPD2, . . . , UPD7 have a logic level corresponding to the test mode entry in response to the toggling of the test strobe signal UPD_STROBE.

In such a state that the test mask signal UPD_MASK of the test command TEST_CMD(N-BIT) is activated to a logic high, the test operation is selected when the test operation signals UPD0, UPD1, UPD2, . . . , UPD7 have a logic level corresponding to the test operation in response to the toggling of the test strobe signal UPD_STROBE.

The test operation must be selected after the test mode entry. If the test operation signals UPD0, UPD1, UPD2, . . . , UPD7 for selecting the test operation are inputted in a state that the DIMM does not enter the test mode, the normal test operation cannot be performed.

The process in which the test data TESTS_DATA from the memory cell array 224 of the DRAMs 220 passes through the test signal I/O unit 240 after the completion of the test operation is similar to the process of entering the test mode and the process of selecting the test operation but has the following difference.

Like the test command TEST_CMD(N-BIT), the test data TESTS_DATA uses the test mask signal UPD_MASK outputted through the DQ pad UDM, and the test strobe signal UPD_STROBE outputted from the DQ pad UDQS.

In the case of the test command TEST_CMD(N-BIT), the plurality of test operation signals UPD0, UPD1, UPD2, . . . , UPD7 are received through the DQ pads UDQ0 to UDQ7. However, in the case of the test data TESTS_DATA, a plurality of test data UPTD0 to UPTD7 are outputted.

Therefore, when the test data TESTS_DATA is outputted through the test signal I/O unit 240, data signals D1 to D7 determined by the logic levels of the test data UPTD0 to UPTD7 are outputted in response to the toggling of the test strobe signal UPD_STROBE in such a state that the test mask signal UPD_MASK of the test data TESTS_DATA is deactivated to a logic low level.

Next, the process of successively selecting a plurality of test operations will be described with reference to FIG. 7(B).

While FIG. 7(A) illustrates the test operation performed when the process of entering the test mode, the process of selecting the test operation, and the process of outputting the test data after the completion of the test operation are successively performed one time, FIG. 7(B) illustrates the result of two test operations. More specifically, two test operations are successively selected by successively performing the process of entering the test mode and the process of selecting the test operation two times, and the process of outputting the test data is repeated two times.

Although the test operations are successively performed two times in FIG. 7(B), the test operations can be successively performed more than two times.

As described above, since the DIMM is configured with DRAMs having a larger number of the I/O pads relative to the actual operation mode, the DRAMs provided in the DIMM can be simultaneously connected through the extra I/O pads to the memory controller and the test mode controller, which are provided outside the DIMM.

That is, it is possible to selectively enter the normal mode and the test mode even on the DIMM.

Therefore, even when the environment using the DIMM is not an elec environment where the test is performed using an external device, but a mount environment where the test is performed using no external device, the DIMM can selectively enter the test mode and the normal mode, thereby effectively reducing the test analysis time.

In the above-described embodiments, positions and kinds of the logic gates and transistors can be changed according to polarities of the inputted signals.

While the present invention has been described with respect to the specific embodiments, it will be apparent to those skilled in the art that various transpositions, changes, and modifications may be made without departing from the spirit and scope of the invention as defined in the following claims.

What is claimed is:

1. A dual in-line memory module (DIMM) for use in a test, comprising:
 a memory array with a plurality of memories, each of which includes a plurality of first data input/output pads and a plurality of second data input/output pads;

a test signal input/output unit provided in the respective memories to perform an input/output operation of a test signal with an external test mode controller for a test mode operation by using the plurality of second data input/output pads; and a normal data input/output unit provided in the respective memories to perform an input/output operation of a normal data with an external memory controller for a normal mode operation by using the plurality of first data input/output pads, wherein the first data input/output pads are used by the normal data input/output unit and the second data input/output pads are used by the test signal input/output unit, and the first data input/output pads are not shared with the second data input/output pads.

2. The DIMM as recited in claim 1, wherein each of the memories includes $2^{N-1}$ number of the first data input/output pads and $2^{N-1}$ number of the second data input/output pads, where N is a positive integer.

3. The DIMM as recited in claim 2, wherein the value of N is 4.

4. The DIMM as recited in claim 1, wherein the test signal includes:

a test command generated from the test mode controller and inputted to the memory controller provided in the respective memories; and a test data outputted from the memory cell array to the test mode controller.

5. The DIMM as recited in claim 4, wherein the test input/output unit includes:

a DQ pad connected to the test mode controller;

a signal input/output path transferring the test command inputted through the DQ pad to the memory controller, or transferring the test data outputted from the memory cell array to the DQ pad; and a buffering unit for buffering the test command and the test data inputted/outputted between the DQ pad and the test signal input/output path.

6. The DIMM as recited in claim 5, wherein the test signal input/output path includes:

a test command decoding unit for decoding the test command inputted through the DQ pad to generate a test mode select signal; and a test data converting unit for converting serial test data from the memory cell array into parallel test data.

7. The DIMM as recited in claim 6, wherein the test command includes:

a test strobe signal;

a test mode mask signal for controlling a test mode entry; and a plurality of test operation signals for selecting a test mode operation.

8. The DIMM as recited in claim 7, wherein the test command decoding unit includes:

a test operation clock generating unit for generating a test operation clock in response to the test strobe signal and the test mode mask signal; and a test mode select signal outputting unit for outputting the plurality of test operation signals as the test mode select signal in response to the test operation clock.

9. The DIMM as recited in claim 6, wherein the buffering unit includes:

an input buffer for buffering the test command through the DQ pad and transferring the buffered test command to the test command decoding unit; and an output buffer for buffering the test data outputted from the test data converting unit and transferring the buffered test data to the DQ pad.

10. The DIMM as recited in claim 1, wherein the normal data input/output unit includes:

a DQ pad connected to the memory controller;

a normal data input/output path transferring the normal data inputted through the DQ pad to the memory cell array provided in the respective memories, or transferring the normal data outputted from the memory cell array to the DQ pad; and a buffering unit for buffering the normal data inputted/outputted between the DQ pad and the normal data input/output path.

11. A packaged memory test system, comprising:

a memory controller for controlling a normal mode operation of a memory;

a test mode controller for controlling a test mode operation of the memory; and a dual in-line memory module (DIMM) including a plurality of first pins connected to the memory controller, a plurality of second pins connected to the test mode controller, the DIMM being configured to selectively perform a normal operation and a test operation, the first pins and the second pins not being shared with one another, wherein the DIMM includes:

a memory array with a plurality of memories, each of which includes a plurality of first data input/output pads and a plurality of second data input/output pads;

a test signal input/output unit provided in the respective memories to perform an input/output operation of a test signal with an external test mode controller for a test mode operation by using the plurality of second data input/output pads; and a normal data input/output unit provided in the respective memories to perform an input/output operation of a normal data with an external memory controller for a normal mode operation by using the plurality of first data input/output pads, wherein the first data input/output pads are used by the normal data input/output unit and the second data input/output pads are used by the test signal input/output unit, and the first data input/output pads are not shared with the second data input/output pads.

12. The packaged memory test system as recited in claim 11, wherein each of the memories includes $2^{N-1}$ number of the first data input/output pads and $2^{N-1}$ number of the second data input/output pads, where N is a positive integer.

13. The packaged memory test system as recited in claim 12, wherein the value of N is 4.

14. The packaged memory test system as recited in claim 11, wherein the test signal includes:

a test command generated from the test mode controller and inputted to the memory controller provided in the respective memories; and a test data outputted from the memory cell array to the test mode controller.

15. The packaged memory test system as recited in claim 14, wherein the test input/output unit includes:

a DQ pad connected to the test mode controller;

a signal input/output path for transferring the test command inputted through the DQ pad to the memory controller, or transferring the test data outputted from the memory cell array to the DQ pad; and a buffering unit for buffering the test command and the test data inputted/outputted between the DQ pad and the test signal input/output path.

16. The packaged memory test system as recited in claim 15, wherein the test signal input/output path includes:
a test command decoding unit for decoding the test command inputted through the DQ pad to generate a test mode select signal; and
a test data converting unit for converting serial test data from the memory cell array into parallel test data.

17. The packaged memory test system as recited in claim 16, wherein the test command includes:
a test strobe signal;
a test mode mask signal for controlling a test mode entry; and
a plurality of test operation signals for selecting a test mode operation.

18. The packaged memory test system as recited in claim 17, wherein the test command decoding unit includes:
a test operation clock generating unit for generating a test operation clock in response to the test strobe signal and the test mode mask signal; and
a test mode select signal outputting unit for outputting the plurality of test operation signals as the test mode select signal in response to the test operation clock.

19. The packaged memory test system as recited in claim 16, wherein the buffering unit includes:
an input buffer for buffering the test command through the DQ pad and transferring the buffered test command to the test command decoding unit; and
an output buffer for buffering the test data outputted from the test data converting unit and transferring the buffered test data to the DQ pad.

20. The packaged memory test system as recited in claim 11, wherein the normal data input/output unit includes:
a DQ pad connected to the memory controller;
a normal data input/output path transferring the normal data inputted through the DQ pad to the memory cell array provided in the respective memories, or transferring the normal data outputted from the memory cell array to the DQ pad; and
a buffering unit for buffering the normal data inputted/outputted between the DQ pad and the normal data input/output path.

21. A method for operating a dual in-line memory module (DIMM) for use in a test, the DIMM including a plurality of memories having $2^N$ number of data input/output pads, where N is a positive integer, the method comprising:
at the plurality of memories, performing an input/output operation of a test signal with an external test mode controller through $2^{N-1}$ number of data input/output pads for a test mode operation; and
at the plurality of memories, performing an input/output operation of a normal data with an external memory controller through $2^{N-1}$ data input/output pads for a normal mode operation, the $2^{N-1}$ data input/output pads used for the input/output operation of the normal data not being shared with the $2^{N-1}$ data input/output pads used for the input/output operation of the test signal.

22. The method as recited in claim 21, wherein the value of N is 4.

23. The method as recited in claim 21, wherein the test signal includes:
a test command generated from the test mode controller and inputted to the memory controller provided in the respective memories; and
a test data outputted from the memory cell array to the test mode controller.

24. The method as recited in claim 23, wherein the performing of the input/output operation of the test signal includes:
decoding the test command inputted from the test mode controller to generate a test mode select signal, and transferring the generated test mode select signal to the memory controller provide in the plurality of memories; and
converting serial test data from the memory cell array provided in the plurality of memories into parallel test data, and transferring the parallel test data to the test mode controller.

* * * * *